United States Patent [19]

Chian et al.

[11] Patent Number: 5,682,336

[45] Date of Patent: Oct. 28, 1997

[54] SIMULATION OF NOISE BEHAVIOR OF NON-LINEAR CIRCUIT

[75] Inventors: Mojy C. Chian, Satellite Beach; Kevin J. Moye; Brent A. Myers, both of Palm Bay, all of Fla.

[73] Assignee: Harris Corporation, Melbourne, Fla.

[21] Appl. No.: 386,785

[22] Filed: Feb. 10, 1995

[51] Int. Cl.[6] .................... G01R 31/28; G06F 19/00
[52] U.S. Cl. ............................ 364/578; 364/489
[58] Field of Search ..................... 364/578, 148; 257/256; 324/628, 76.13, 309, 624; 395/23; 331/127

[56] References Cited

U.S. PATENT DOCUMENTS

| H1458 | 7/1995 | Slack | 324/76.13 |
|---|---|---|---|
| 4,594,677 | 6/1986 | Barlow | 364/578 |
| 4,876,509 | 10/1989 | Perlmutter | 324/309 |

OTHER PUBLICATIONS

Sarpeshkar et al., "White Noise in MOS Transistors and Resistors," Nov. 1993, IEEE Circuits and Devices, pp. 23–29.

*Primary Examiner*—Kevin J. Teska
*Assistant Examiner*—Phallaka Kik
*Attorney, Agent, or Firm*—Charles E. Wands

[57] ABSTRACT

The noise performance of a non-linear circuit design is measured prior to circuit fabrication by a circuit modelling and analysis mechanism, which simulates each noise source as a reduced complexity continuous Gaussian noise waveform. A respective noise source (e.g. thermal or shot) is modelled as a time domain sequence of continuously connected third order polynomial signal waveforms, forming a cubic spline that interconnects successively occurring Gaussian signal amplitude values. For each type of noise source, its associated Gaussian function is determined by the product of the constant multipliers associated with that type of source. The number of points processed for each noise source depends upon the time width of a noise analysis window. Any changes to the noise performance-analyzed circuit design are then effected and the noise performance of the modified circuit is reanalyzed, as necessary, prior to fabrication, thereby ensuring that the operational behavior of the manufactured circuit will meet its intended noise performance specification.

24 Claims, 3 Drawing Sheets

SIMULATION OF NOISE BEHAVIOR OF NON-LINEAR CIRCUIT

FIELD OF THE INVENTION

The present invention relates to the testing and manufacture of integrated circuits, especially RF circuit designs, and is particularly directed to a mechanism for efficiently modelling the noise behavior of multiple noise source (non-linear) circuit elements used in any circuit-configured design, so that any required changes to a given circuit design may be effected and analyzed prior to circuit fabrication, thereby effectively ensuring that the manufactured circuit will faithfully perform to its design specification.

BACKGROUND OF THE INVENTION

Electronic circuit designs are frequently driven by noise specifications. In a circuit employing non-linear elements, such as transistors, there are multiple noise sources associated with each non-linear element. For example, to evaluate the total noise performance of a bipolar transistor, it is necessary to take into account seven noise sources, including five thermal and two shot noise sources, associated with the respective nodes and PN junctions of the respective linear components (resistors and current sources) into which the transistor may be modelled.

Since even a reduced complexity transistor circuit design, such as one employed for IC RF applications, may contain seven to ten transistors and associated bias resistors (where the noise performance for an individual resistor may be represented by an associated thermal noise source), a not uncommon computationally intensive signal analysis problem facing the circuit designer is the need to account for eighty or more noise sources per circuit. Because of such a large number of noise sources, a widely practiced conventional approach to the problem is to simply ignore it during the circuit design phase, and wait until the results of the test and evaluation phase subsequent to circuit fabrication.

Another common approach is to linearize the circuit about an operating point and perform linear noise analysis in the frequency domain. Even though this method is widely used in CAD tools and by circuit designers, it is not applicable to highly non-linear circuits, such as mixers and oscillators. For such circuits, a non-linear time domain noise analysis is required. An obvious drawback to this approach is the cost of fabrication of each circuit iteration requiring a redesign. Some circuit designers calculate circuit performance to selected noise sources, based upon their experience and knowledge of previous designs.

However, such an approach is both incomplete and is not readily available. Other schemes involve brute force superposition analysis of the circuit for each noise source, one at a time, which is so obviously time consuming and computationally intensive, that it is impractical and not cost effective in today's extremely competitive semiconductor market.

SUMMARY OF THE INVENTION

In accordance with the present invention, the above described problems of conventional methodologies for estimating the noise behavior of an integrated circuit architecture containing a plurality of circuit components interconnected with one another to carry out a prescribed signal processing operation, in the course of manufacture of said integrated circuit architecture, comprises first generating a model of the electronic circuit. The time domain circuit model includes noise sources associated with the circuit components, the noise sources producing noise signals having amplitudes that vary with time in a random, non-periodic manner, but are simulated in the model as continuous signal waveforms. Such noise sources include thermal noise and shot noise.

Each noise source is simulated as a Gaussian sequence of random amplitude noise signal values, interconnected by a continuous signal waveform, comprised of successive third order polynomials, thereby forming a cubic spline. Successive noise signal values of the sequence of random amplitude noise signal values have a temporal spacing that is no greater than the inverse of twice the bandwidth of the noise signal.

The time domain behavior of the electronic circuit is then analyzed and an output representative of the noise performance of the circuit, as modelled to include the noise sources, is generated. The analyzed circuit is selectively modified in dependence upon the noise performance output, and then reanalyzed, as necessary, until the model's noise performance satisfies the prescribed criterion. An integrated circuit architecture of the noise performance-acceptable version of the circuit is then fabricated.

Advantageously, since data processing routines for executing both Gaussian-based random number generation and cubic spline functions are readily available for a wide variety of signal processing and data processing applications, the number of noise sources within a given circuit design is not an impediment to realizing a computer simulation of the complete noise behavior of an overall circuit design prior to fabrication. The number of random values processed for each noise source depends upon the time width of a noise analysis window. Since the noise generation subroutines involve reduced complexity mathematical operations, the data processing rates of currently commercially available data processing systems, including desk top and lap top (notebook) units, readily allow all of the noise sources present in a complete circuit design to be taken into account at the same time, so that the total noise performance may be expeditiously determined. As a result, any required changes to noise performance-analyzed circuit design may be effected and the circuit resimulated, as necessary, prior to fabrication, thereby effectively ensuring that the noise performance of the manufactured circuit will meet its intended specification.

DETAILED DESCRIPTION

Figure 1:
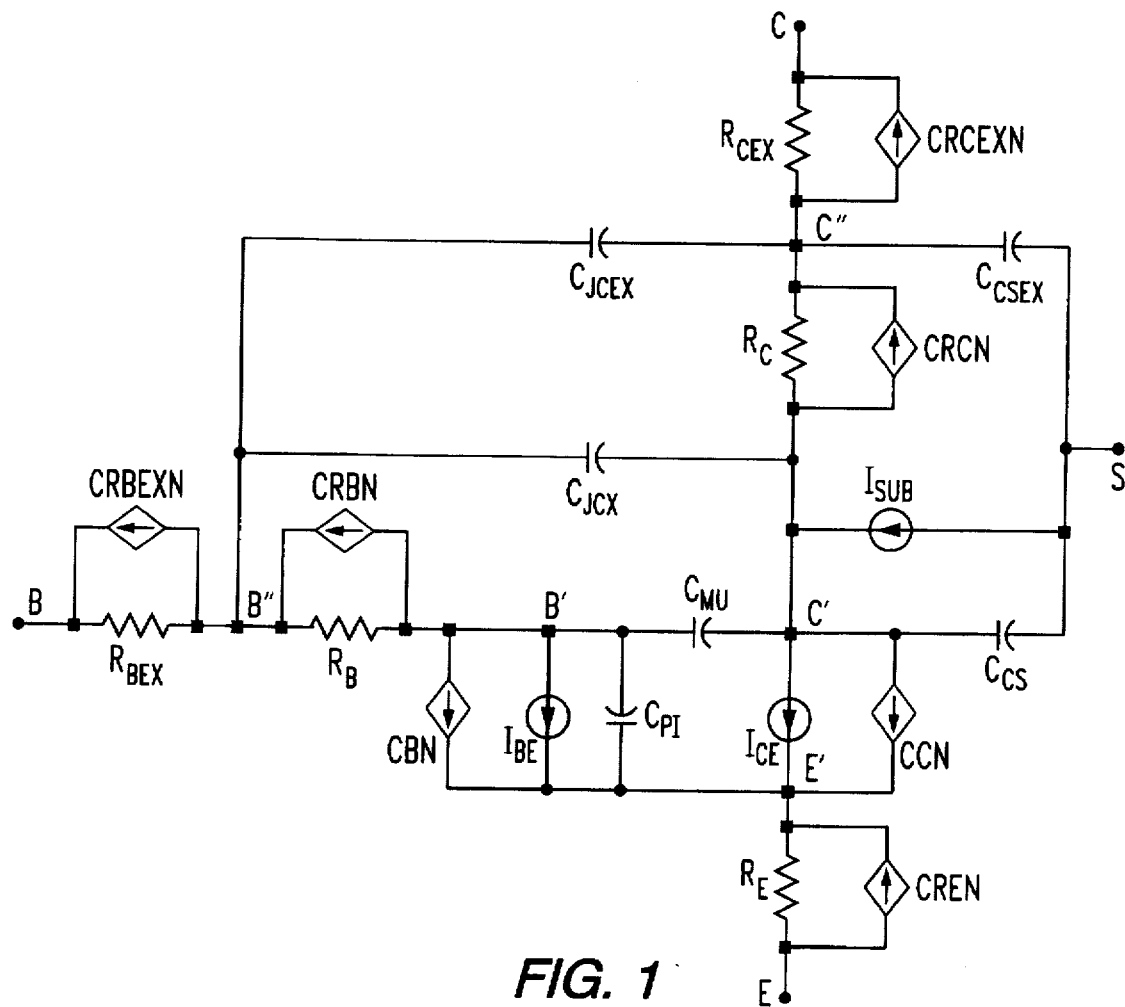
FIG. 1 schematically illustrates a circuit equivalent of bipolar transistor.

Before describing the details of the circuit analysis mechanism of the present invention, which models each noise source of an overall non-linear circuit as a reduced complexity continuous Gaussian noise waveform—implemented as a time domain sequence of non-discontinuously connected third order polynomial signal (cubic spline) waveforms, it should be observed that the present invention resides primarily in what is effectively a computer-based tool for analyzing the overall noise performance of a circuit. Such a design tool readily enables a circuit designer to expeditiously obtain an accurate prediction of the noise behavior of the circuit in the presence of large number of noise sources, all of which are considered at the same time. Since the present invention may be used to analyze any type of circuit, the configuration of the circuit itself and the number of noise sources involved are simply parameters in the analysis process. As a consequence, the operational components of the tool have been illustrated in the drawings by readily understandable functional blocks, which show only those specific details that are pertinent to the present invention, so as not to obscure the disclosure with details which will be readily apparent to those skilled in the art having the benefit of the description herein. Thus, the block diagram illustrations of the Figures are primarily intended to illustrate the major utilitarian components of circuit analysis tool in a convenient functional grouping, whereby the present invention may be more readily understood.

Attention is initially directed to FIG. 1, which shows a circuit equivalent of a bipolar transistor, schematically illustrated as comprising a base terminal B, a collector terminal C, an emitter terminal E, and a substrate terminal S. Connected between base terminal B and a base node B" is a base terminal resistor $R_{BEX}$, having an associated, parallel connected thermal noise source CRBEXN. Connected between base node B" and an internal base node B' is a base resistor $R_B$, having an associated, parallel connected, base thermal noise source CRBN.

Similarly, connected between collector terminal C and a collector node C" is a collector terminal resistor $R_{CEX}$, having an associated, parallel connected thermal noise source CRCEXN, and connected between collector node C" and an internal collector node C' is a collector resistor $R_C$, having an associated, parallel connected, collector thermal noise source CRCN.

Connected between emitter terminal E and an internal emitter node E' is an emitter resistor $R_E$, having an associated, parallel connected, emitter thermal noise source CREN. Connected between internal emitter node E' and internal collector node C' is a collector-emitter current source $I_{CE}$, having an associated parallel-connected collector-emitter current shot noise source CCN. Likewise, connected between internal emitter node E' and internal base node B' is a base-emitter current source $I_{BE}$, having an associated parallel-connected, base-emitter current shot noise source CBN. A substrate current source $I_{SUB}$ is connected between substrate terminal S and internal collector node C'.

Associated with respective nodes of the transistor are inherent parasitic capacitances, specifically a capacitance $C_{JCEX}$ coupled between collector node C" and base node B", a capacitance $C_{CSEX}$ coupled between collector node C" and substrate terminal S, a capacitance $C_{JCX}$ coupled between internal collector node C' and base node B", a capacitance $C_{CS}$ coupled between internal collector node C' and substrate terminal S, a capacitance $C_{MU}$ coupled between internal collector node C' and internal base node B' and a capacitance $C_{PI}$ coupled between internal collector node C' and internal emitter node E'.

Thus, in the transistor circuit model of FIG. 1, there are two shot noise sources (CBN, CCN) and five thermal noise current sources (CRCEXN, CRCN, CRBEXN, CREN and CRBN). The noise signal associated with each thermal noise source is $(4kT/R)^{1/2}$, where T is temperature, k is Boltzman's constant and R is the resistance value. Thus, for example, thermal noise source CREN generates a noise signal $(4kT/R_E)^{1/2}$. For a shot noise source I, the noise is defined as $(2qI)^{1/2}$ and q is electronic charge. Thus, shot noise source CCN generates a noise signal $(2qI_C)^{1/2}$, for example.

As pointed out briefly above, in a given electronic circuit, such as an IC RF amplifier configured of bipolar transistors, each transistor may be modelled as a combination of circuit elements and associated noise sources. For example, in a low noise amplifier circuit, such as the non-limiting example schematically illustrated in FIG. 2, bipolar transistor 11 may be modelled as a plurality of circuit elements (resistors, capacitors and current sources) and noise sources associated with various nodes and PN junctions within the circuit, as schematically illustrated in FIG. 1, described above.

Figure 2:
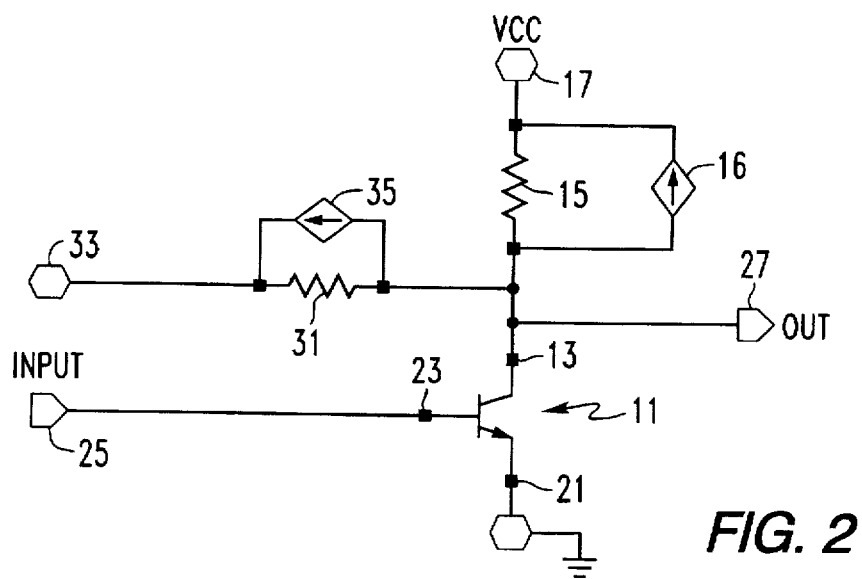
FIG. 2 schematically illustrates a low noise bipolar transistor amplifier circuit.

In the overall amplifier circuit of FIG. 2, transistor 11 has its collector 13 coupled through a resistor 15 to a collector bias (VCC) node 17. Associated (coupled in parallel) with collector resistor 15 is a thermal noise current source 16. The emitter 21 of transistor 11 is coupled to ground, and its base 23 is coupled to an input node 25. The collector 13 is coupled to output node 27. It is also coupled through a coupling resistor 31 to a second input (mixed signal) node 33. Like bias resistor 15, coupling resistor 31 has an associated parallel-coupled thermal noise source 35.

As described previously, since a typical, relatively low complexity transistor circuit design may contain as many as seven to ten transistors and associated bias and coupling resistors, a determination of the noise behavior of the overall circuit can involve accounting for the presence of eighty or more noise sources. In accordance with the invention, this problem is successfully addressed by modelling each noise source as a reduced complexity continuous Gaussian noise waveform, which makes it possible to take all of the noise sources of the circuit design into account simultaneously, in the course of predicting noise performance.

Figure 3:
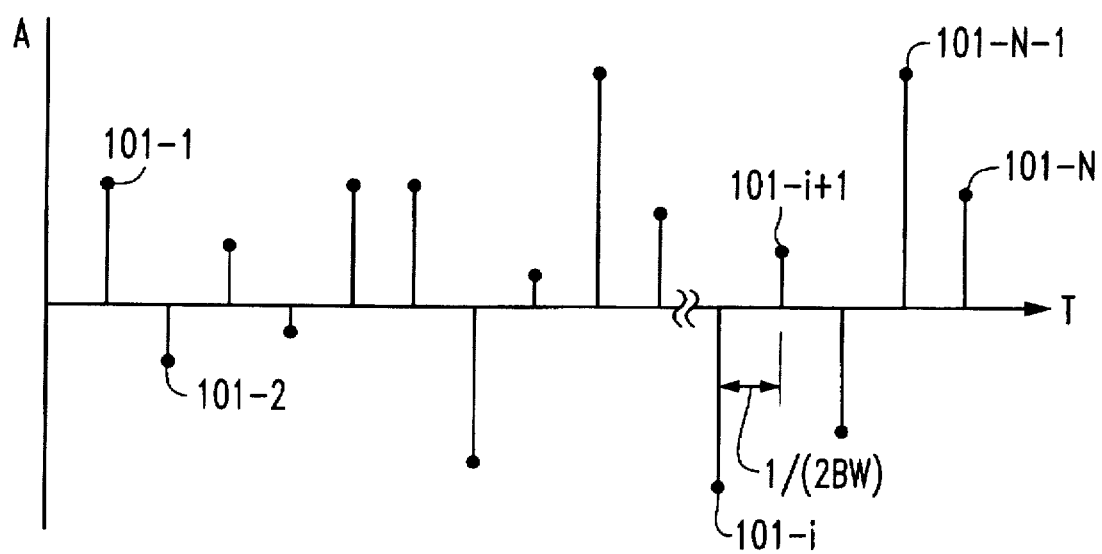
FIG. 3 diagrammatically illustrates the manner in which a noise source may be implemented as a time domain sequence of randomly distributed Gaussian signal amplitude values.
Figure 4:
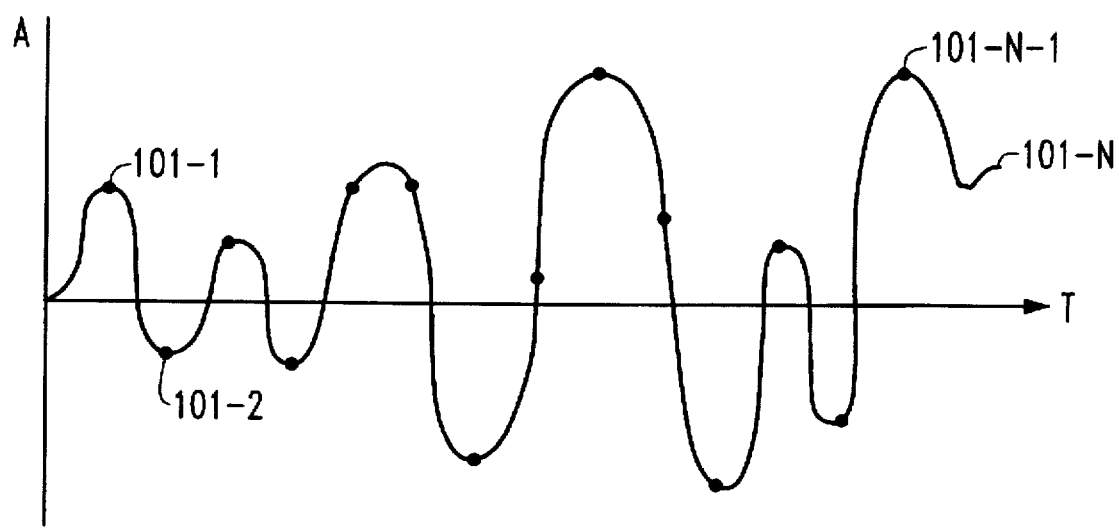
FIG. 4 diagrammatically illustrates a Gaussian noise sequence, wherein each sequential pair of noise points is connected by a respective third order polynomial signal function.

As diagrammatically illustrated in FIG. 3, pursuant to the invention, each respective noise source (which for the present example of a bipolar transistor correspond to the shot noise sources and thermal noise sources of the example of the transistor circuit of FIG. 2) is implemented as a time domain sequence of randomly distributed (Gaussian) signal amplitude values (noise points) 101-1, 101-2, ..., 101-N. The temporal separation δT between successive ones 101-i and 101-i+1 of such noise points is the inverse of twice the bandwidth (BW) of the noise source of interest. Given these Gaussian sequences, each sequential pair of noise points 101-i and 101-i+1 is then connected by means of a respective third order polynomial signal function, as diagrammatically illustrated in FIG. 4, so that what results is a composite signal waveform 310, commonly known as a 'cubic spline' function, that is continuous at each of the noise points 101-i. For a thermal noise source, the amplitude of each noise point 101-i of the cubic spline signal waveform is set to $(4kT/R)^{1/2}$. For a shot noise source, the amplitude of each noise point 101-i is set to $(2qI)^{1/2}$.

Since circuit analysis software for generating both a Gaussian-based random number sequence a cubic spline function involves reduced complexity mathematical operations, and is readily available for a wide variety of signal processing and data processing applications, a model of an overall circuit design is readily implemented by computer simulation, so that all of the noise sources present in a complete circuit design may be taken into account at the same time, so that the total noise performance may be expeditiously determined.

The number of points processed for each noise source depends upon the time width of a noise analysis window. As a result, any required changes to noise performance-analyzed circuit design may be effected and the circuit resimulated, as necessary, prior to fabrication, thereby effectively ensuring that the noise performance of the manufactured circuit will meet its intended specification.

Figure 5:
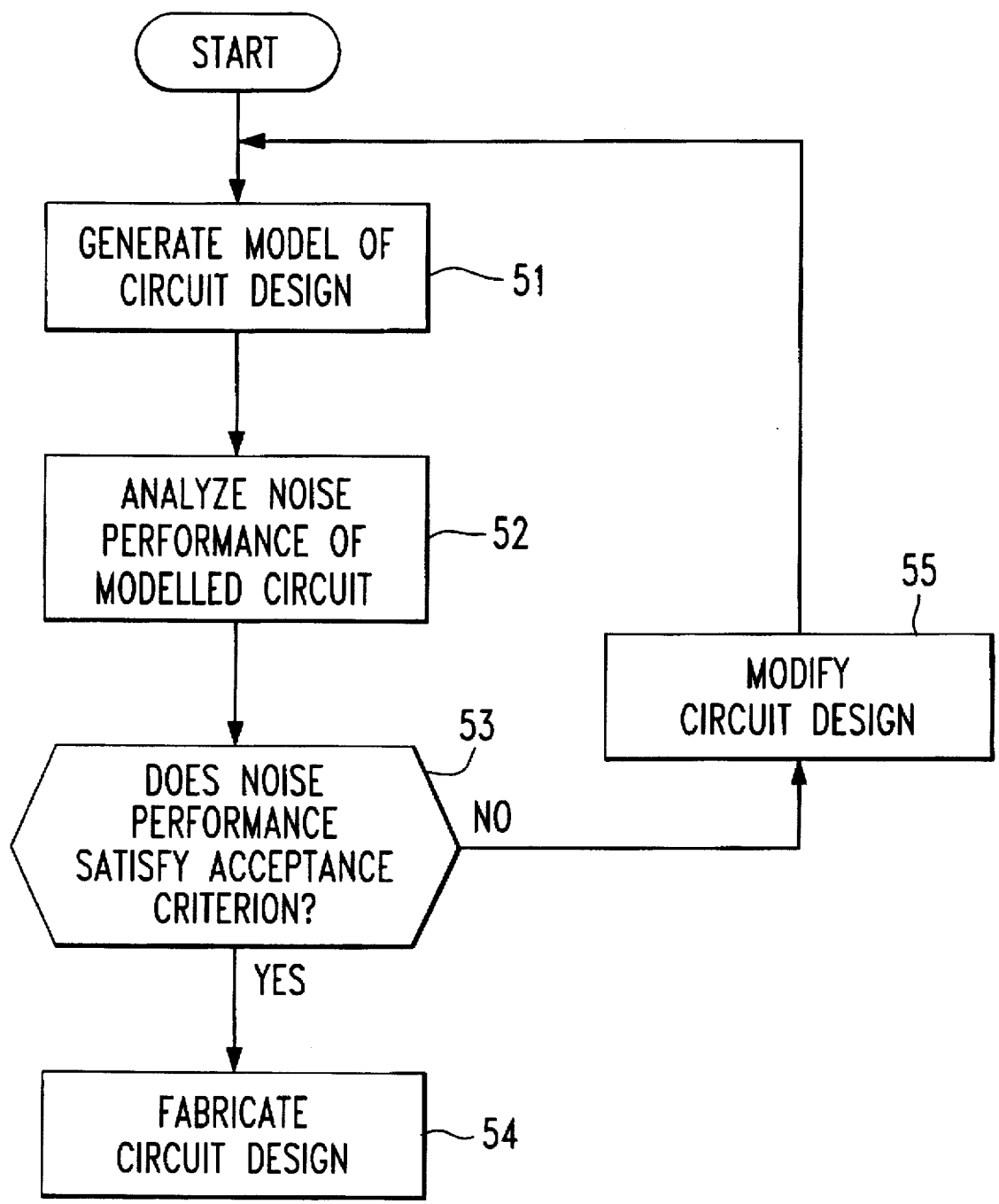
FIG. 5 shows the processing flow of the circuit modelling and noise behavior analysis mechanism of the present invention.

The processing flow of the circuit modelling and noise behavior analysis mechanism described above, to be incorporated into an integrated circuit manufacturing process in accordance with the present invention is diagrammatically illustrated in FIG. 5. First, as shown at step 51, a model of the electronic circuit, which includes noise sources associated with the plural circuit components of the circuits, is generated. The noise sources (thermal and shot) produce noise signals having amplitudes that vary in a random, non-periodic manner, but are simulated in the model as continuous signal waveforms, as described above with reference to FIGS. 3 and 4. Specifically, each noise source is simulated as a Gaussian sequence of random amplitude noise signal values, interconnected by a continuous signal waveform, comprised of successive third order polynomials, thereby forming a cubic spline. (As pointed out above, successive noise signal values of the sequence of random amplitude noise signal values have a temporal spacing that is no greater than the inverse of twice the bandwidth of the noise signal.)

Next, in step 52, the behavior of the electronic circuit model is analyzed and an output representative of the noise performance of the circuit, as modelled to include all of the shot and thermal noise sources, is generated. The analyzed circuit is selectively modified depending upon the noise performance output. In particular, in query step 53, if the noise performance output of the analysis of step 52 satisfies a prescribed noise performance criterion, the process proceeds to step 54, wherein the circuit is fabricated.

On the other hand, if the noise performance output of the analysis of step 52 fails to satisfy the noise performance criterion, the process proceeds to step 55, wherein the circuit is modified. From step 55 the process returns to step 51. This modify and reanalyze sequence is repeated, as necessary, until the model's noise performance satisfies the prescribed criterion. An integrated circuit architecture of the noise performance-acceptable version of the circuit is then fabricated in step 54.

As will be appreciated from the foregoing description, the above described problems of conventional methodologies for estimating the noise behavior of a given circuit design are effectively obviated in accordance with the present invention by modelling each noise source in the circuit as a reduced complexity continuous noise source waveform (such as either thermal or shot) implemented as a time domain sequence of third order polynomial signal (cubic spline) waveforms, that non-discontinuously interconnect successively occurring randomly distributed (Gaussian) signal amplitude values.

Since both Gaussian-based random number generation and cubic spline functions are readily executed using conventional data processing application software employed for a wide variety of applications, all of the noise sources within a given circuit design may be simulated at the same time, so that the noise behavior of an overall circuit design may be determined prior to fabrication. The number of random values processed for each noise source depends upon the time width of a noise analysis window.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. For use with the manufacture of an electronic circuit architecture, said electronic circuit architecture containing an electronic circuit of plural circuit components configured to carry out prescribed signal processing functionality, said circuit components having associated analog noise sources of analog noise signals, a method of measuring the performance of said electronic circuit including the effect of said associated analog noise sources of said components of said electronic circuit, but exclusive of noise induced in said electronic circuit by sources of signals external to said components of said electronic circuit, and which plural associated analog noise sources of said components vary in a non-periodic manner, prior to reducing said electronic circuit into tangible form as said electronic circuit architecture, comprising the steps of:

(a) generating a time domain model of said electronic circuit, which model includes said associated analog noise sources of said components;

(b) simulating said associated analog noise sources of said components as continuous signal waveforms; and (c) analyzing the time-domain behavior of said electronic circuit in the presence of said associated analog noise sources of said components as simulated in step (b), and generating an output signal representative of said performance of said electronic circuit.

2. A method according to claim 1, wherein step (c) comprises analyzing said time-domain behavior of said electronic circuit in response to the simultaneous presence of each of respectively different ones of said associated analog noise sources of said components.

3. A method according to claim 1, wherein said analog noise includes thermal noise.

4. A method according to claim 1, wherein said analog noise includes shot noise.

5. A method according to claim 1, wherein said analog noise includes multiple types of analog noise.

6. A method according to claim 5, wherein said multiple types of analog noise include Gaussian noise.

7. A method according to claim 1, wherein step (b) comprises generating a respective source of analog noise as a sequence of amplitude noise signal values and generating a respective continuous signal waveform that interconnects random amplitude noise signal values of said sequence.

8. A method according to claim 7, wherein said sequence of random amplitude noise signal values is a Gaussian sequence.

9. A method according to claim 8, wherein said respective continuous signal waveform is a cubic spline.

10. A method according to claim 7, wherein successive noise signal values of said sequence of random amplitude noise signal values have a temporal spacing that is no greater than the inverse of twice the bandwidth of said analog noise signal.

11. A method according to claim 1, wherein said components of said electronic circuit include semiconductor circuit elements having one or more PN junctions.

12. A method according to claim 11, wherein said components of said electronic circuit further include passive circuit elements.

13. A method according to claim 12, wherein said components of said electronic circuit include transistors and resistors.

14. A method according to claim 1, wherein said electronic circuit includes non-linear circuit components.

15. A method of manufacturing an integrated circuit architecture which includes an electronic circuit comprised of a plurality of circuit components interconnected with one another to carry out a prescribed signal processing operation, said circuit components having associated analog noise sources of analog noise signals, said method comprising the steps of:

(a) generating a time-domain model of said electronic circuit, which time-domain model includes said associated analog noise sources of said plurality of circuit components, but exclusive of noise induced in said electronic circuit by sources of signals external to said circuit components of said electronic circuit, said associated analog noise sources of said circuit components producing noise signals having amplitudes that vary in a random, non-periodic manner, but are simulated in said model as continuous signal waveforms;

(b) analyzing the time-domain behavior of said electronic circuit as modelled in step (a), and generating an output representative of the noise performance of said electronic circuit as modelled to include said associated analog noise sources of said circuit components in step (a);

(c) selectively modifying said analyzed electronic circuit in dependence upon the noise performance output generated in step (b), and reanalyzing the selectively modified electronic circuit, as necessary, until said output satisfies a prescribed noise performance criterion for said electronic circuit; and (d) constructing an integrated circuit architecture of said electronic circuit whose noise performance output has satisfied said prescribed noise performance criterion in step (c).

16. A method according to claim 15, wherein step (a) includes simulating a respective one of said associated analog noise sources of said circuit components as a sequence of random amplitude noise signal values, and generating a continuous signal waveform that interconnects the random amplitude noise signal values of said sequence.

17. A method according to claim 16, wherein said sequence of random amplitude noise signal values is a Gaussian sequence.

18. A method according to claim 17, wherein said respective continuous signal waveform is a cubic spline.

19. A method according to claim 16, wherein successive noise signal values of said sequence of random amplitude noise signal values have a temporal spacing that is no greater than the inverse of twice the bandwidth of said noise signal.

20. A method according to claim 16, wherein said associated analog noise sources of said circuit components generate multiple types of analog noise.

21. A method according to claim 20, wherein said multiple types of analog noise include thermal noise and shot noise.

22. A method according to claim 15 wherein said components of said electronic circuit include semiconductor circuit elements having one or more PN junctions.

23. A method according to claim 22, wherein said components of said electronic circuit further include passive circuit elements.

24. A method according to claim 15, wherein said components of said electronic circuit include transistors and resistors.

* * * * *